United States Patent [19]

McCormick

[11] Patent Number: 4,849,379

[45] Date of Patent: Jul. 18, 1989

[54] DIELECTRIC COMPOSITION

[75] Inventor: Cornelius J. McCormick, Hockessin, Del.

[73] Assignee: E. I. Du Pont de Nemours and Company, Wilmington, Del.

[21] Appl. No.: 149,507

[22] Filed: Jan. 28, 1988

[51] Int. Cl.$^4$ ................................................ C03C 8/16
[52] U.S. Cl. ........................................ 501/20; 501/17; 501/32; 501/66; 524/444; 524/560
[58] Field of Search ................. 501/17, 20, 32, 66; 524/444, 560

[56] References Cited

U.S. PATENT DOCUMENTS

| | | | |
|---|---|---|---|
| 4,591,758 | 5/1986 | Barth et al. | 501/20 |
| 4,624,934 | 11/1986 | Kokubu et al. | 501/17 |
| 4,613,648 | 9/1986 | Usala | 524/555 |
| 4,654,095 | 3/1987 | Steinberg | 156/89 |
| 4,655,864 | 4/1987 | Rellick | 156/89 |
| 4,749,665 | 6/1988 | Yano et al. | 501/17 |

*Primary Examiner*—William R. Dixon, Jr.
*Assistant Examiner*—Anthony J. Green

[57] ABSTRACT

A composition for making low K dielectric layers which is an admixture of finely divided solids consisting essentially of (a) lead-free amorphous borosilicate glass containing $Al_2O_3$, a mixture of oxides of alkali metals, alkaline earth metals or mixtures thereof containing $Li_2O$ and (b) an inorganic filler selected from quartz and mixtures of quartz with 0.5–5% wt. inert oxides having a TCE equal to or greater than 7.

6 Claims, No Drawings

DIELECTRIC COMPOSITION

FIELD OF INVENTION

The invention relates to improved thick film dielectric compositions, particularly those having a low dielectric constant.

BACKGROUND OF THE INVENTION

The development of very high speed integrated circuit (VHSIC) technology has created a need for dielectric materials with low dielectric constant. Dielectric constant (K) is a measure of the insulating ability of a material. It is the ratio of the capacitance of a given material to the capacitance of air for the same thickness. Dielectric constant of air is assigned the value 1. The need for low dielectric constant increases with frequency of the electrical signal. The use of low K dielectric materials minimizes signal loss in the dielectric, crosstalk between signal lines, and signal rise and decay times.

Several approaches to low K materials have received considerable attention, including the use of polymeric materials (K=2-4), glass, glass-ceramics and ceramic materials (K=3.8-6). In addition to dielectric properties, physical, chemical, electrical and mechanical properties must be considered for material selection. Electrical design parameters, packaging, manufacturing and end use requirements further restrict the applicability of many materials.

The lowest dielectric constants can be obtained with polymeric materials. Thermal considerations are the major restriction on utility of polymeric materials. High process and environmental temperatures, thermal expansion and thermal conductivity preclude the use of low K polymeric materials in many applications.

For applications requiring high process or use temperatures, especially 500° C. or above, inorganic materials are required. The lowest K value for such inorganic materials is K=3.8 for $SiO_2$. Because of the refractory nature of $SiO_2$, it is usually necessary to use it in combination with other materials, such as glass or glass ceramics, which substantially raises the minimum value of K that can be realized.

For circuitry which is to be printed on 96% $Al_2O_3$ substrates, the thermal coefficient of expansion (TCE) of the $Al_2O_3$ substrate and the dielectric must be matched to prevent warping and/or cracking of multilayer circuits. In general, for glass and glass ceramic systems, low K usually means low TCE and a high glass softening point. Materials such as cordierite and mullite have a low dielectric constant but are not suitable for use on $Al_2O_3$ substrates because of TCE mismatch. Furthermore, compositions containing mullite or cordierite in conjunction with a low softening point glass in general tend to raise TCE, lower the firing temperature, and increase K.

The combination of such material properties with design criteria and end use requirements for a good low K dielectric frequently and severely limit the materials which heretofore could be used. Thus, there is a serious need for low K screen-printable thick film compositions which can be fired conventionally on 96% wt. alumina substrates.

SUMMARY OF THE INVENTION

In its primary aspect, the invention is directed to a composition for making low K dielectric layers which is an admixture of finely divided solids consisting essentially of:

(a) 55-75% wt. lead-free amorphous borosilicate glass in which the weight ratio of $B_2O_3$ to $SiO_2$ is 0.22-0.55 containing 0.5-1.5% wt. $Al_2O_3$, 1.5-4.0% wt. of a mixture of oxides of alkali metals, alkaline earth metals or mixtures thereof, which oxide mixture contains 0.3-1.0% wt. $Li_2O$, basis total glass; and (b) 45-25% wt. of an inorganic filler selected from quartz and mixtures of quartz with minor amounts of other inert oxide fillers having a TCE equal to or greater than 7.

In a second aspect, the invention is directed to screen-printable thick film compositions comprising the above-described composition dispersed in an organic medium.

In a still further aspect, the invention is directed to low K dielectric layers prepared by printing a layer of the above-described thick film composition upon an alumina substrate and firing the composition to effect volatilization of the organic medium therefrom, viscous phase sintering of the glass which may result in partial dissolution of quartz and the other fillers into the glass.

DETAILED DESCRIPTION OF THE INVENTION

A. Glass Composition

The glass compositions which can be used in the invention are amorphous borosilicate glasses containing 0.5-1.5% wt. $Al_2O_3$ and 1.5-4.0% wt. alkali metal oxides and/or alkaline earth metal oxides. The borosilicate component of the glass must be within the range of 94.5-98.3% wt. of the glass. If less than 94.5% wt. borosilicate is used, the glass becomes too electroconductive and the dissipation factor (DF) becomes too high. On the other hand, if the borosilicate content is higher than 98.3% wt., the sintering temperature of the glass exceeds practical firing temperatures. The weight ratio of $B_2O_3$ to $SiO_2$ should be within the range of 0.22 to 0.55 and preferably 0.25 to 0.40. It is preferred that the glass be capable of viscous phase sintering at 850°-950° C. A particularly preferred glass composition has the composition by weight 72% $SiO_2$, 25% $B_2O_3$, 1% $Al_2O_3$, 1% $K_2O$, 0.5% $Na_2O$ and 0.5% $Li_2O$.

A small amount of alumina is needed in the glass to inhibit dissolution of the ceramic fillers, particularly quartz, into the glass when it is fired. At least 0.5% wt. alumina is needed for this purpose. However, if more than 1.5% wt. is used, the viscosity of the glass becomes excessive and wetting and sintering properties are affected adversely. In addition, it is required to have from 1.5 to 4.0% wt. oxides of alkali and/or alkaline earth metals or mixtures thereof which contain 0.3 to 1.0% wt. $Li_2O$. At least 1.5% wt. of such metal oxides are needed to obtain the proper low viscosity of the glass during firing. However, if more than 4.0% wt. is used, the conductivity of the sintered composition is likely to be too high. In order to minimize the amount of alkaline ions in the glass, it is preferred that the glass contain 0.3-1.0% wt. $Li_2O$ by which the lowest useful sintering viscosity can be obtained with the least amount of alkaline ions, i.e., alkali metal and alkaline metal earth ions. In addition, the amount of other alkali metal oxides ($Na_2O$, $K_2O$) should be kept below 3.0% wt. basis total glass. The above-described glasses should contain essentially no Bi, Pb or other large polarizable ions which adversely affect the dielectric constant.

The glasses can be prepared by conventional glassmaking techniques by mixing the desired components in the desired proportions and heating the mixture to form melt. As is well known in the art, heating is conducted to a peak temperature and for a time such that the melt becomes entirely liquid and homogeneous. In the present work, the components are premixed by shaking in a polyethylene jar with plastic balls and then melted in a platinum crucible at the desired temperature. The melt is heated at the peak temperature for a period of 1 to 1½ hours. The melt is then quenched. The crude frit is then jet milled to the desired particle size.

The above-described glasses are particularly desirable for use in VHSIC applications because of their low polarizability and thus low dielectric constant. Moreover, because these glasses have relatively high $SiO_2$ concentrations, they are more durable than those with high $B_2O_3$ concentrations. Because borosilicate glasses by themselves tend to have high softening points, it is necessary to reduce the softening point by the addition of small amounts of the oxides of alkali and/or alkaline earth metal oxides. However, the amount of such oxides must be minimized to avoid ionic migration which in turn leads to poor insulating properties.

A particular advantage of the glass composition of the invention is that they yield highly hermetic layers as measured by the migration of $Na^+$ ions from 1N NaCl solution under a 10 V bias.

B. Inorganic Filler

The preferred inorganic filler for the invention is alpha-quartz which has a very low K value (3.8) and a very high TCE (11.2 ppm/°C.). Thus the use of other fillers would be expected to degrade both of these properties. However, it has been found that the addition of quite small amounts of $Al_2O_3$ to the composition, e.g., 0.5–5% wt., have the very desirable effect of reducing the bowing of substrates on which the compositions are applied.

In this regard, it has been found that such warpage (bowing) of a 7.2 cm diagonal substrate decreased from +157 microns to −18 microns after 12 layers of dielectric and 24 firings when 1 vol. % of quartz was replaced by $Al_2O_3$. Electrical and mechanical properties of the fired composition were completely satisfactory for thick film dielectric.

Dielectric layers are, of course, subject to multiple firings during which there is a tendency for a substantial amount of the quartz to become dissolved into the glass. This change of the composition from dispersed crystalline quartz to dissolved amorphous silica results in a decrease of the TCE of the composition. By the addition of alumina, it is believed that the dissolution of the quartz into the glass during firing is inhibited, thereby keeping the TCE of the fired layer higher so that it more closely matches the TCE of the alumina substrate.

The fillers used in the composition of the invention do not undergo sintering at the normal firing conditions of 850°–950° C. Typical firing cycles are 20–25 minutes to peak temperature, 10 minutes at peak temperature and 25–30 cooldown time.

The particle size of the solids of the invention is not critical as to dielectric constant values. However, it is important that the average particle size be from 1–15 microns and preferably 2–10 microns in order to obtain good green (unfired) density and to minimize shrinkage upon firing.

C. Organic Medium

The above-described inorganic particles are mixed with an inert liquid medium (vehicle) by mechanical mixing (e.g., on a roll mill) to form a pastelike composition having suitable consistency and rheology for screen printing. The latter is printed as a "thick film" on conventional ceramic substrates in the conventional manner.

The main purpose of the organic medium is to serve as a vehicle for dispersion of the finely divided solids of the composition in such form that it can readily be applied to ceramic or other substrates. Thus, the organic medium must first of all be one in which the solids are dispersible with an adequate degree of stability. Secondly, the rheological properties of the organic medium must be such that they lend good application properties to the dispersion.

Most thick film compositions are applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling, and good firing properties. Satisfactory appearance of the fired composition is also important.

In view of all these criteria, a wide variety of liquids can be used as organic medium. The organic medium for most thick film compositions is typically a solution of resin in a solvent frequently also containing thixotropic agents and wetting agents. The solvents usually boil within the range of 130°–350° C.

By far, the most frequently used and preferred resin for this purpose is ethyl cellulose. However, resins such as ethylhydroxyethyl cellulose, wood rosin, mixtures of ethyl cellulose and phenolic resins, polymethacrylates of lower alcohols and monobutyl ether of ethylene glycol monoacetate can also be used.

Suitable solvents include kerosene, mineral spirits, dibutylphthalate, butyl carbitol, butyl carbitol acetate, hexylene glycol and high boiling alcohols and alcohol esters. Various combinations of these and other solvents are formulated to obtain the desired viscosity and volatility.

Among the thixotropic agents which are commonly used are hydrogenated castor oil and derivatives thereof and ethyl cellulose. It is, of course, not always necessary to incorporate a thixotropic agent since the solvent resin properties coupled with the shear thinning inherent in any suspension may alone be suitable in this regard. Suitable wetting agents include phosphate esters and soya lecithin.

The ratio of organic medium to solids in the paste dispersions can vary considerably and depends upon the manner in which the dispersion is to be applied and the kind of organic medium used. Normally, to achieve good coverage, the dispersions will contain complementally by weight 40–90% solids and 60–10% organic medium.

The pastes are conveniently prepared on medium (vehicle) utilized is determined mainly by the final desired formulation viscosity and print thickness.

D. Multilayer Applications

In their use for the manufacture of multilayer structures, the compositions of the invention can be used with noble metals and with most base metal conductors other than copper. Thus they may be used with Ni, Au, Ag, Pd/Ag and Pt/Ag. Conductors of unalloyed silver metal can be used, but are not preferred because of the tendency of the silver metal to migrate into the dielectric layer upon firing. However, copper can also be used with the compositions of the invention if the composition is modified to provide oxygen-releasing compounds to facilitate burnout of organics. Such compounds include materials such as $Co_3O_4$ and $MnO_2$. Unlike many such dielectric compositions, those of the invention may be fired in either oxidizing atmospheres such as air or in non-oxidizing atmospheres such as nitrogen. The choice of firing atmosphere will usually be dictated by the oxidation stability of the conductive metal under firing conditions.

EXAMPLES

EXAMPLE 1

A hermetic, screen printable thick film dielectric composition suitable for use on 96% $Al_2O_3$ substrate with a dielectric constant of 4 was prepared by roll milling together a glass and quartz in a 3/2 ratio with a vehicle composed of ethyl cellulose, Texanol ® solvent and a phosphate ester wetting agent in a ratio of 5/90/5 such that the paste had a final viscosity of 260-330 Pa.s at 2.5 $sec^{-1}$ shear rate. The glass composition is 72% $SiO_2$, 25% $B_2O_3$, 1% $Al_2O_3$, 1% $K_2O$, 0.5% $Na_2O$, 0.5% $Li_2O$. Paste was screen printed and fired in air at 905° C. for 6 min. with a total cycle time of 58 min. Two layers of fired paste gave a total thickness of 38-43 microns. With gold electrodes the dielectric constant was 4.0 and deformation of a 2 in.×2 in. 96% $Al_2O$ substrate after 24 firings was +3 mil/in. (Positive bowing means center of substrate is higher than edges.)

EXAMPLE 2

A hermetic, screen printable, thick film dielectric composition similar to that in Example 1 was prepared by replacing 1% of the quartz filler with $Al_2O_3$. Dielectric constant was 4.1 and deformation of a 2 in.×2 in. 96% $Al_2O_3$ substrate was −1 mil/in. after 24 firings.

EXAMPLE 3

A thick film dielectric composition was prepared and tested as in Example 1 except that the glass was 74% $SiO_2$, 15% $B_2O_3$, 1% $Al_2O_3$, 4% $Na_2O$, 6% PbO. The fired layer had a dielectric constant of 4.6 but was not hermetic.

EXAMPLE 4

A thick film dielectric composition was prepared and tested as in Example 1 except that the glass was 81% $SiO_2$, 13% $B_2O_3$, 2% $Al_2O_3$, 4% $Na_2O$. The fired layer had a dielectric constant of 4.3 but was not hermetic.

I claim:
1. A composition for making low K dielectric layers which is an admixture of finely divided solids consisting essentially of:
    (a) 55-75% wt. lead-free amorphous borosilicate glass in which the weight ratio of $B_2O_3$ to $SiO_2$ is 0.22-0.55 containing 0.5-1.5% wt. $Al_2O_3$, 1.5-4.0% wt. of a mixture of oxides of alkali metals, alkaline earth metals or mixtures thereof, which oxide mixture contains 0.3-1.0% wt. $Li_2O$, basis total glass; and
    (b) 45-25% wt. of a ceramic filler selected from alpha-quartz and mixtures thereof with 0.5-5.0% wt. inert oxides having a TCE equal to or greater than 7.
2. The composition of claim 1 in which the borosilicate glass contains 0.9-3.0% wt. mixed $Na_2O$ and $K_2O$.
3. The composition of claim 1 in which the borosilicate component of the glass consists essentially of 72% wt. $SiO_2$ and 28% wt. $B_2O_3$.
4. The composition of claim 1 in which the ceramic filler is a mixture of alpha-quartz and 0.5-5.0% wt. $Al_2O_3$.
5. A screen printable thick rilm composition comprising the composition of claim 1 dispersed in an organic medium comprising resin dissolved in in organic solvent.
6. The composition of claim 5 in which the resin is ethyl cellulose.

* * * * *